(12) United States Patent
Usami

(10) Patent No.: US 6,531,755 B1
(45) Date of Patent: Mar. 11, 2003

(54) SEMICONDUCTOR DEVICE AND MANUFACTURING METHOD THEREOF FOR REALIZING HIGH PACKAGING DENSITY

(75) Inventor: Tatsuya Usami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/686,800

(22) Filed: Oct. 12, 2000

(30) Foreign Application Priority Data

Oct. 15, 1999 (JP) ............................................. 11-294079

(51) Int. Cl.$^7$ ............................................... H01L 29/00
(52) U.S. Cl. ...................... 257/520; 257/501; 257/506; 257/508; 257/621; 257/920
(58) Field of Search ................................. 257/520, 508, 257/501, 506, 621, 920

(56) References Cited

U.S. PATENT DOCUMENTS

| 5,804,508 A | * | 9/1998 | Gnade et al. | ................ | 438/778 |
| 6,013,581 A | * | 1/2000 | Wu et al. | .................... | 438/734 |
| 6,127,285 A | * | 10/2000 | Nag | ........................... | 438/788 |

FOREIGN PATENT DOCUMENTS

| JP | 03060071 A | * | 3/1991 |
| JP | 6-302589 | | 10/1994 |
| JP | 9-237833 | | 9/1997 |
| JP | 10-335458 | | 12/1998 |

* cited by examiner

Primary Examiner—Nathan J. Flynn
Assistant Examiner—Remmon R. Fordé
(74) Attorney, Agent, or Firm—Sughrue Mion, PLLC

(57) ABSTRACT

In a semiconductor device in which an interlayer insulating layer is formed of a low density material (porous silica etc.) and a hole or a trench is formed in the interlayer insulating layer by processing the interlayer insulating layer and an electrically conductive material is coated on the processed surface of the hole or trench for establishing electrical connection, the density of part of the interlayer insulating layer near the processed surface of the hole or trench is increased in comparison with other parts of the interlayer insulating layer. The densification process is conducted by the elimination of microvoids near the processed surface, for example. The densification or the microvoid elimination can be conducted by use of ammonia water, vapor of ammonia water, ammonia plasma treatment, etc. By the densification process, coating of the electrically conductive material (Cu etc.) on the processed surface of the hole or trench can be conducted successfully in the following steps and thereby the manufacture of semiconductor devices of stable performance can be realized. By the use of the low density material for the interlayer insulating layer, the space between wires in the semiconductor device can be made smaller and thereby miniaturization and speeding up of semiconductor device can be attained.

4 Claims, 15 Drawing Sheets

- FIRST P-SiO2 LAYER 404
- FIRST POROUS SILICA LAYER 403
- FIRST P-SiN LAYER 402
- Cu WIRING 401

- FIRST PHOTORESIST LAYER 405
- FIRST P-SiO2 LAYER 404
- FIRST POROUS SILICA LAYER 403
- FIRST P-SiN LAYER 402
- Cu WIRING 401

- FIRST PHOTORESIST LAYER 405
- FIRST P-SiO2 LAYER 404
- FIRST POROUS SILICA LAYER 403
- FIRST P-SiN LAYER 402
- Cu WIRING 401

- FIRST P-SiO₂ LAYER 404
- FIRST POROUS SILICA LAYER 403
- FIRST P-SiN LAYER 402
- Cu WIRING 401

- FIRST P-SiO₂ LAYER 404
- FIRST POROUS SILICA LAYER 403
- FIRST P-SiN LAYER 402
- Cu WIRING 401

- FIRST TaN LAYER 406
- FIRST P-SiO₂ LAYER 404
- FIRST POROUS SILICA LAYER 403
- FIRST P-SiN LAYER 402
- Cu WIRING 401

- FIRST Cu PLATING LAYER 108
- FIRST Cu SEED LAYER 107
- FIRST TaN LAYER 106
- FIRST P-SiO2 LAYER 104
- FIRST POROUS SILICA LAYER 103
- FIRST P-SiN LAYER 102
- Cu WIRING 101

- FIRST P-SiO2 LAYER 104
- FIRST POROUS SILICA LAYER 103
- FIRST P-SiN LAYER 102
- Cu WIRING 101

- SECOND PHOTORESIST LAYER 112
- SECOND P-SiO2 LAYER 111
- SECOND POROUS SILICA LAYER 110
- SECOND P-SiN LAYER 109
- FIRST P-SiO2 LAYER 104
- FIRST POROUS SILICA LAYER 103
- FIRST P-SiN LAYER 102
- Cu WIRING 101

- SECOND PHOTORESIST LAYER 112
- SECOND P-SiO2 LAYER 111
- SECOND POROUS SILICA LAYER 110
- SECOND P-SiN LAYER 109
- FIRST P-SiO2 LAYER 104
- FIRST POROUS SILICA LAYER 103
- FIRST P-SiN LAYER 102
- Cu WIRING 101

- SECOND P-SiO2 LAYER 111
- SECOND POROUS SILICA LAYER 110
- SECOND P-SiN LAYER 109
- FIRST P-SiO2 LAYER 104
- FIRST POROUS SILICA LAYER 103
- FIRST P-SiN LAYER 102
- Cu WIRING 101

FIG. 10A

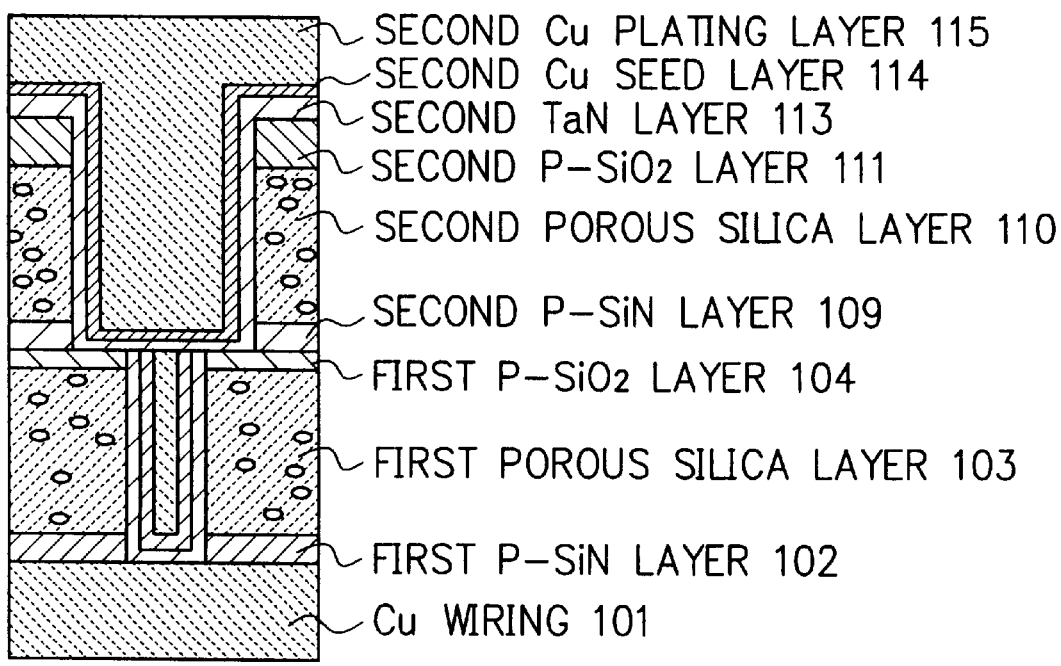

- SECOND Cu PLATING LAYER 115
- SECOND Cu SEED LAYER 114
- SECOND TaN LAYER 113
- SECOND P-SiO2 LAYER 111
- SECOND POROUS SILICA LAYER 110
- SECOND P-SiN LAYER 109
- FIRST P-SiO2 LAYER 104
- FIRST POROUS SILICA LAYER 103
- FIRST P-SiN LAYER 102
- Cu WIRING 101

FIG. 10B

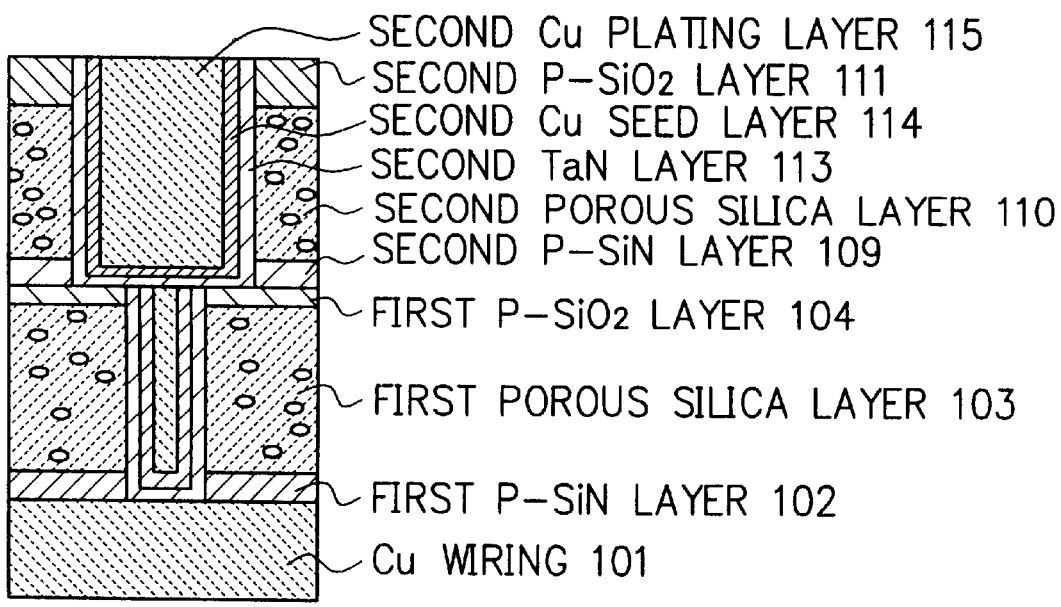

- SECOND Cu PLATING LAYER 115
- SECOND P-SiO2 LAYER 111
- SECOND Cu SEED LAYER 114
- SECOND TaN LAYER 113
- SECOND POROUS SILICA LAYER 110
- SECOND P-SiN LAYER 109
- FIRST P-SiO2 LAYER 104
- FIRST POROUS SILICA LAYER 103
- FIRST P-SiN LAYER 102
- Cu WIRING 101

FIG. 13A

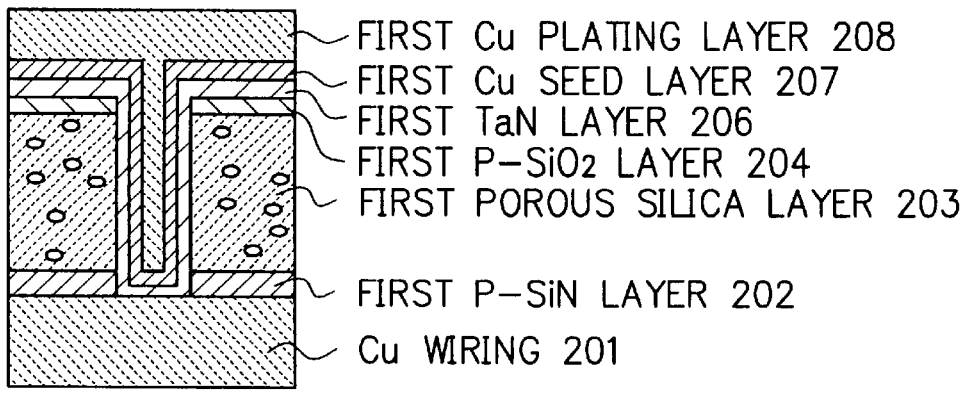

- FIRST Cu PLATING LAYER 208
- FIRST Cu SEED LAYER 207
- FIRST TaN LAYER 206
- FIRST P-SiO₂ LAYER 204
- FIRST POROUS SILICA LAYER 203
- FIRST P-SiN LAYER 202
- Cu WIRING 201

FIG. 13B

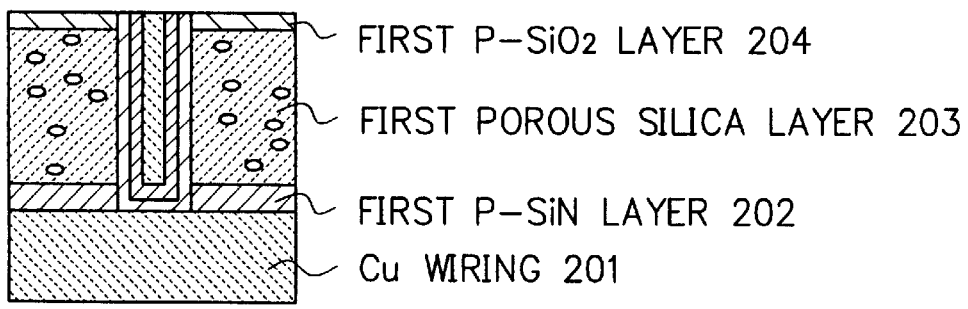

- FIRST P-SiO₂ LAYER 204
- FIRST POROUS SILICA LAYER 203
- FIRST P-SiN LAYER 202
- Cu WIRING 201

FIG. 13C

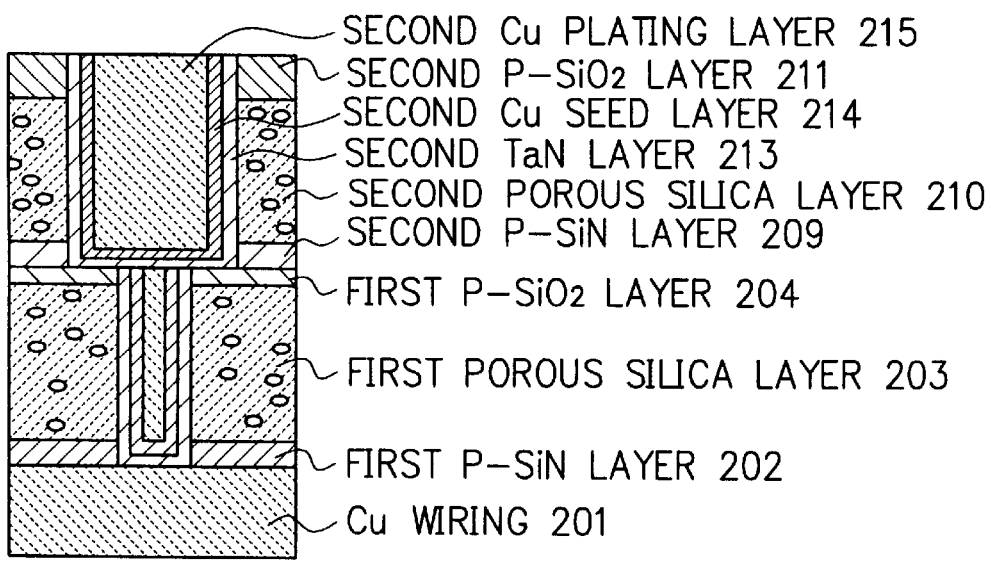

- SECOND Cu PLATING LAYER 215
- SECOND P-SiO₂ LAYER 211
- SECOND Cu SEED LAYER 214
- SECOND TaN LAYER 213
- SECOND POROUS SILICA LAYER 210
- SECOND P-SiN LAYER 209
- FIRST P-SiO₂ LAYER 204
- FIRST POROUS SILICA LAYER 203
- FIRST P-SiN LAYER 202
- Cu WIRING 201

FIG. 16A

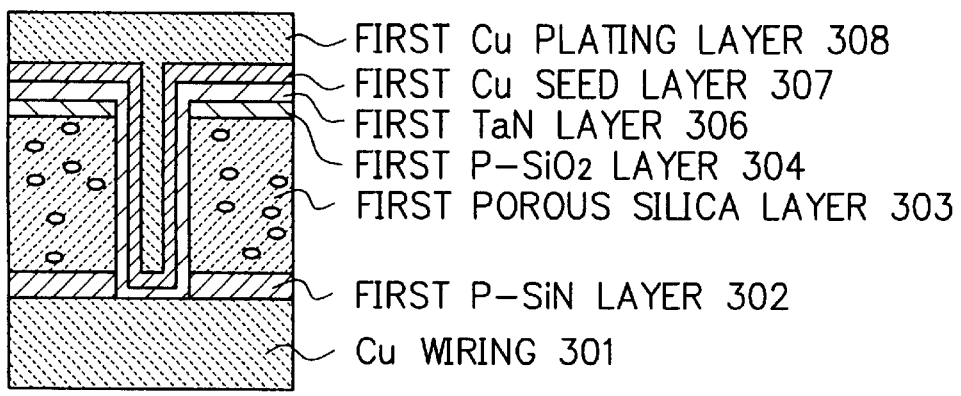

- FIRST Cu PLATING LAYER 308
- FIRST Cu SEED LAYER 307
- FIRST TaN LAYER 306
- FIRST P-SiO2 LAYER 304
- FIRST POROUS SILICA LAYER 303
- FIRST P-SiN LAYER 302
- Cu WIRING 301

FIG. 16B

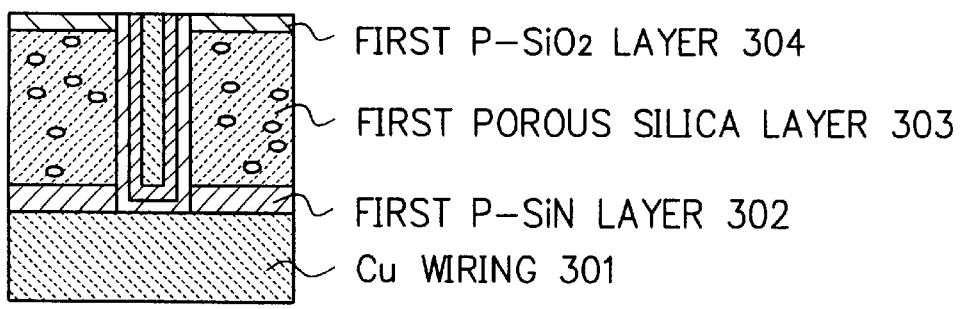

- FIRST P-SiO2 LAYER 304
- FIRST POROUS SILICA LAYER 303
- FIRST P-SiN LAYER 302
- Cu WIRING 301

FIG. 16C

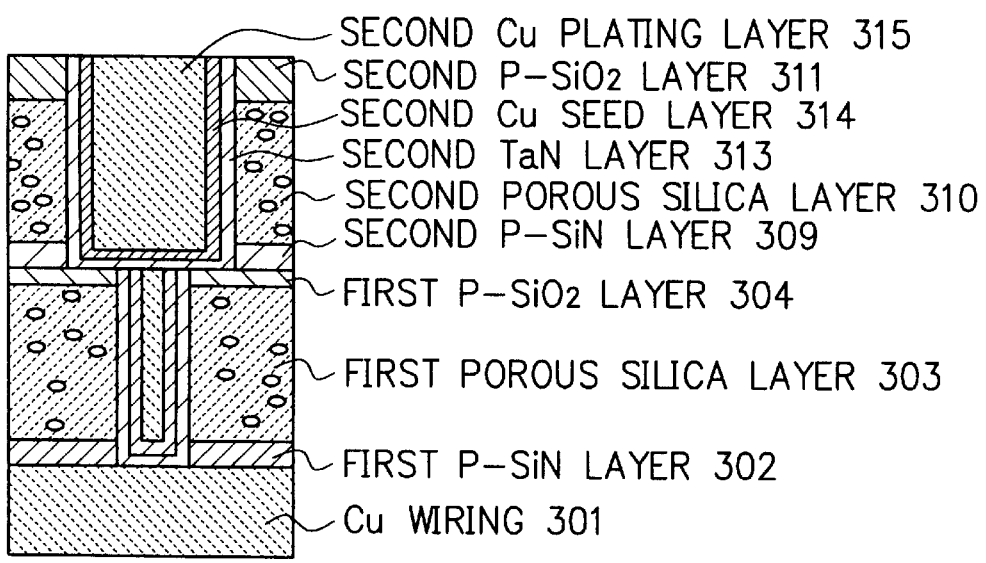

- SECOND Cu PLATING LAYER 315
- SECOND P-SiO2 LAYER 311
- SECOND Cu SEED LAYER 314
- SECOND TaN LAYER 313
- SECOND POROUS SILICA LAYER 310
- SECOND P-SiN LAYER 309
- FIRST P-SiO2 LAYER 304
- FIRST POROUS SILICA LAYER 303
- FIRST P-SiN LAYER 302
- Cu WIRING 301

SEMICONDUCTOR DEVICE AND MANUFACTURING METHOD THEREOF FOR REALIZING HIGH PACKAGING DENSITY

BACKGROUND OF THE INVENTION

The present invention relates to a semiconductor device and a manufacturing method of a semiconductor device, and in particular, to a semiconductor device and a manufacturing method of a semiconductor device suitable for realizing higher packaging density.

DESCRIPTION OF THE RELATED ART

Miniaturization and integration of semiconductor devices are proceeding with very high speed and the width (line) of wires and the interval (space) between wires in the integrated circuits are becoming smaller and smaller. When the interval (space) between wires becomes smaller, the electric capacity between the wires increases and thereby signal speed on the wires is necessitated to be lowered. As countermeasures for resolving the problem, wires which are made of low-resistance metallic materials, low-permittivity films (low-permittivity interlayer insulating (dielectric) layers) which are placed between the wires, etc. can be used. As for the low-permittivity films, a relative dielectric constant of 2.5 or smaller can not be implemented by a high density film, therefore films or layers having microvoids can be regarded as good candidates. However, when the low-permittivity layer (film) is processed (etched) and thereby the microvoids are exposed on the processed (etched) surface of the layer, the following processes might be affected by the exposed microvoids. For example, when the processed surface of the layer has to be coated by metal in the next process, the metal coating can not be done successfully due to the existence of the microvoids on the processed surface.

In the following, an example of a conventional manufacturing method of a semiconductor device employing porous silica will be explained in detail. Incidentally, the "porous silica" means an $SiO_2$ layer which includes microvoids whose diameters are 10 Å~100 Å and which also includes Si—H bonds, Si—$CH_3$ bonds, Si—$C_2H_5$ bonds, and/or Si—$C_6H_5$ (phenyl group) bonds.

FIG. 1A through FIG. 3 are cross sectional views showing the conventional manufacturing method of a semiconductor device employing the porous silica for the interlayer insulating layer, which has been conducted by the present inventor.

First, a first P-SiN (Plasma SiN) layer 402 of a thickness of about 500 Å was formed on Cu wiring 401 by means of plasma CVD (Chemical Vapor Deposition). Subsequently, porous silica was coated on the first P-SiN layer 402 and baked at 400° C. for 30 minutes, thereby a porous silica layer 403 of a thickness of about 4000 Å was formed. On the first porous silica layer 403, a first P-$SiO_2$ (Plasma $SiO_2$) layer 404 of a thickness of about 500 Å was formed (FIG. 1A). Subsequently, a first photoresist layer 405 was patterned on the first P-$SiO_2$ layer 404 (FIG. 1B). Subsequently, the first P-$SiO_2$ layer 404 and thereafter the first porous silica layer 403 were processed (etched) using the first photoresist layer 405 as a mask. The etching was stopped at the first P-SiN layer 402 (FIG. 1C). Subsequently, the first photoresist layer 405 was removed by means of oxygen plasma ashing and thereafter wet stripping was conducted (FIG. 2A). Subsequently, part of the first P-SiN layer 402 corresponding to the etched part of the first porous silica layer 403 was removed by etching back (using no mask), thereby the Cu wiring 401 was exposed (FIG. 2B).

Subsequently, RF plasma etching was conducted in a sputter chamber and thereafter a first TaN layer 406 of a thickness of about 500 Å was formed by means of collimated sputtering (FIG. 2C). As shown in FIG. 2C, due to the roughness (microvoids) of the processed (etched) surface of the first porous silica layer 403, the first TaN layer 406 could not be deposited successfully on the processed surface of the first porous silica layer 403. Subsequently, a first Cu seed layer 407 was sputtered to a thickness of about 500 Å and thereafter a first Cu plating layer 408 was formed thereon (FIG. 3). At the stage which is shown in FIG. 3, a plurality of voids 409 had occurred in the plug (via hole).

As explained above, in the conventional manufacturing method of a semiconductor device employing porous silica for the interlayer insulating layer, the processed (etched) surface of the porous silica tends to be uneven due to the microvoids, thereby the barrier metal layer (first TaN layer 406) and the seed layer (first Cu seed layer 407) which are formed so as to cover the processed surface of the porous silica are necessitated to have pin holes and/or thin parts. Due to the irregularity of the barrier metal layer and the seed layer, the plug (first Cu plating layer 408) which is formed on the seed layer also tends to have voids, and thereby the resistance of the plug (via hole) becomes unstable.

SUMMARY OF THE INVENTION

It is therefore the primary object of the present invention to provide a semiconductor device and a manufacturing method of a semiconductor device by which the unevenness of the processed surface of the interlayer insulating layer can be avoided even when a low-permittivity layer made of low density materials (porous silica, for example) is used as the interlayer insulating layer, thereby the occurrence of the voids in the plug (via hole) can be eliminated, and thereby stable performance of the semiconductor device can be ensured.

In accordance with a first aspect of the present invention, there is provided a semiconductor device in which an interlayer insulating layer is formed of a low density material and a hole or a trench is formed in the interlayer insulating layer by processing the interlayer insulating layer and an electrically conductive material is coated on the processed surface of the hole or trench for establishing electrical connection. In the semiconductor device, the density of part of the interlayer insulating layer near the processed surface of the hole or trench is increased in comparison with other parts of the interlayer insulating layer.

In accordance with a second aspect of the present invention, in the first aspect, the low density material is a porous material.

In accordance with a third aspect of the present invention, in the second aspect, the porous material is porous silica.

In accordance with a fourth aspect of the present invention, in the third aspect, the porous silica at least includes Si—H bonds and/or Si—CH3 bonds.

In accordance with a fifth aspect of the present invention, there is provided a semiconductor device in which an interlayer insulating layer is formed of a low density material and a hole or a trench is formed in the interlayer insulating layer by processing the interlayer insulating layer and an electrically conductive material is coated on the processed surface of the hole or trench for establishing electrical connection. In the semiconductor device, microvoids are removed in part of the interlayer insulating layer near the processed surface of the hole or trench.

In accordance with a sixth aspect of the present invention, in the fifth aspect, the low density material is a porous material.

In accordance with a seventh aspect of the present invention, in the sixth aspect, the porous material is porous silica.

In accordance with an eighth aspect of the present invention, in the seventh aspect, the porous silica at least includes Si—H bonds and/or Si—CH3 bonds.

In accordance with a ninth aspect of the present invention, there is provided a manufacturing method of a semiconductor device having an interlayer insulating layer which is formed of a low density material. The manufacturing method comprises a processing step, a densification step and a conductive material coating step. In the processing step, the interlayer insulating layer is processed and thereby a hole or a trench is formed in the interlayer insulating layer. In the densification step, the density of part of the interlayer insulating layer near the processed surface of the hole or trench is increased. In the conductive material coating step, an electrically conductive material is coated on the processed surface of the hole or trench for establishing electrical connection.

In accordance with a tenth aspect of the present invention, in the ninth aspect, the manufacturing method further comprises a hydrophobic treatment step. In the hydrophobic treatment step, the processed surface of the hole or trench of the interlayer insulating layer is made hydrophobic.

In accordance with an eleventh aspect of the present invention, in the ninth aspect, the densification step is conducted by use of ammonia water.

In accordance with a twelfth aspect of the present invention, in the ninth aspect, the densification step is conducted by use of vapor of ammonia water.

In accordance with a thirteenth aspect of the present invention, in the ninth aspect, the densification step is conducted by means of ammonia plasma treatment.

In accordance with a fourteenth aspect of the present invention, in the thirteenth aspect, the ammonia plasma treatment is also used for removing photoresist which has been used in the processing step for the formation of the hole or trench in the interlayer insulating layer.

In accordance with a fifteenth aspect of the present invention, in the tenth aspect, the hydrophobic treatment step is conducted by means of HMDS (hexamethyldisilazane) treatment.

In accordance with a sixteenth aspect of the present invention, in the ninth aspect, the low density material is a porous material.

In accordance with a seventeenth aspect of the present invention, in the sixteenth aspect, the porous material is porous silica.

In accordance with an eighteenth aspect of the present invention, in the seventeenth aspect, the porous silica at least includes Si—H bonds and/or Si—CH3 bonds.

BRIEF DESCRIPTION OF THE DRAWINGS

The objects and features of the present invention will become more apparent from the consideration of the following detailed description taken in conjunction with the accompanying drawings, in which:

FIG. 4A through FIG. 10B are cross sectional views showing a manufacturing method of a semiconductor device in accordance with a first embodiment of the present invention;

FIG. 11A through FIG. 13C are cross sectional views showing a manufacturing method of a semiconductor device in accordance with a second embodiment of the present invention; and FIG. 14A through FIG. 16C are cross sectional views showing a manufacturing method of a semiconductor device in accordance with a third embodiment of the present invention.

DESCRIPTION OF THE PREFERRED EMBODIMENTS

Figure 1A:
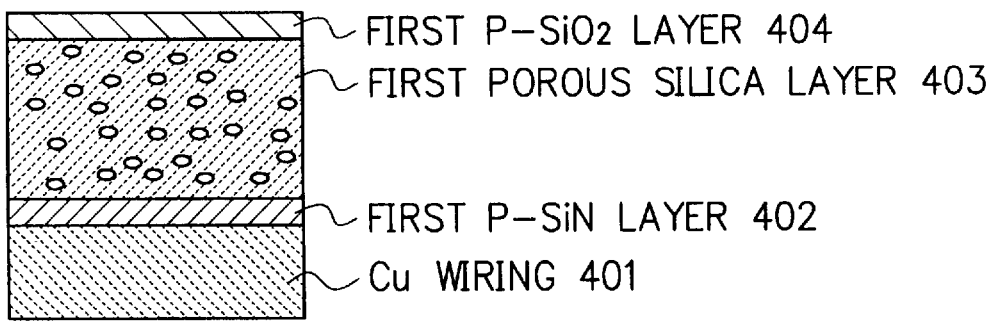
FIG. 1A through FIG. 3 are cross sectional views showing a conventional manufacturing method of a semiconductor device employing porous silica for an interlayer insulating layer.
Figure 1B:
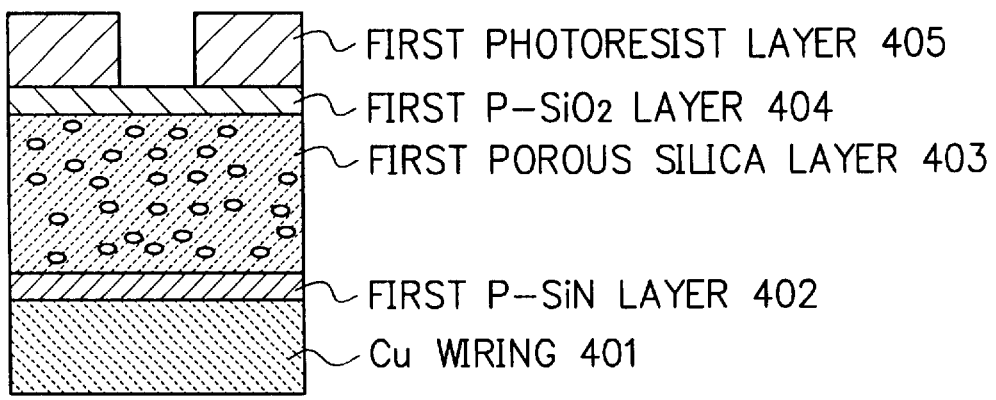
Figure 1C:
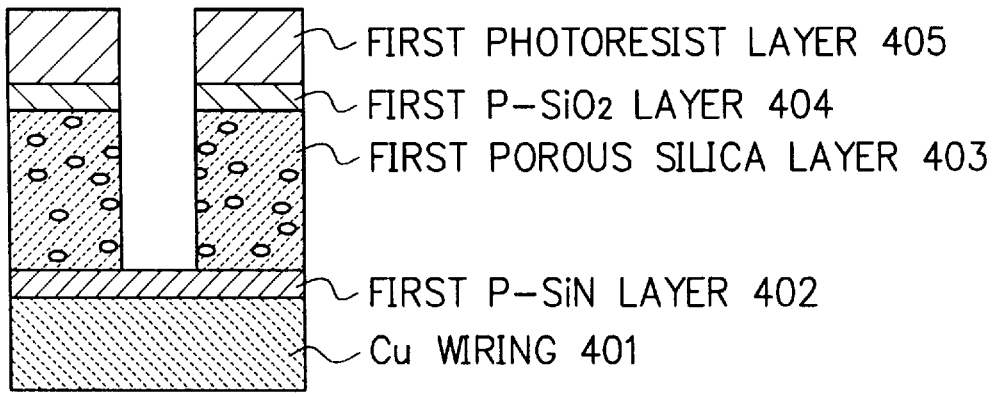
Figure 2A:
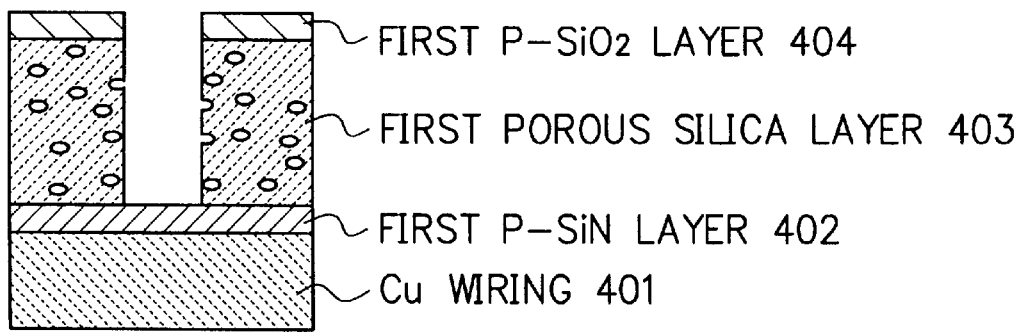
Figure 2B:
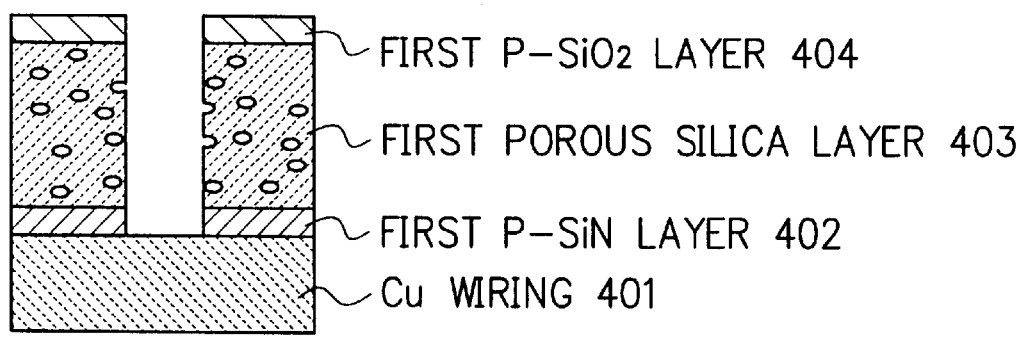
Figure 2C:
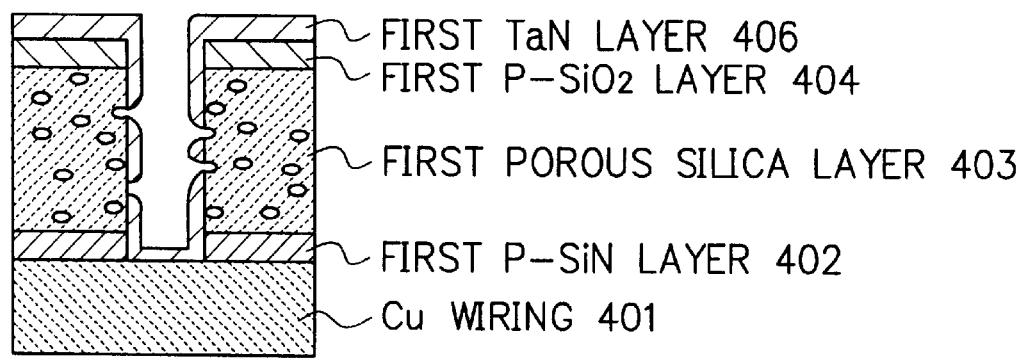
Figure 3:
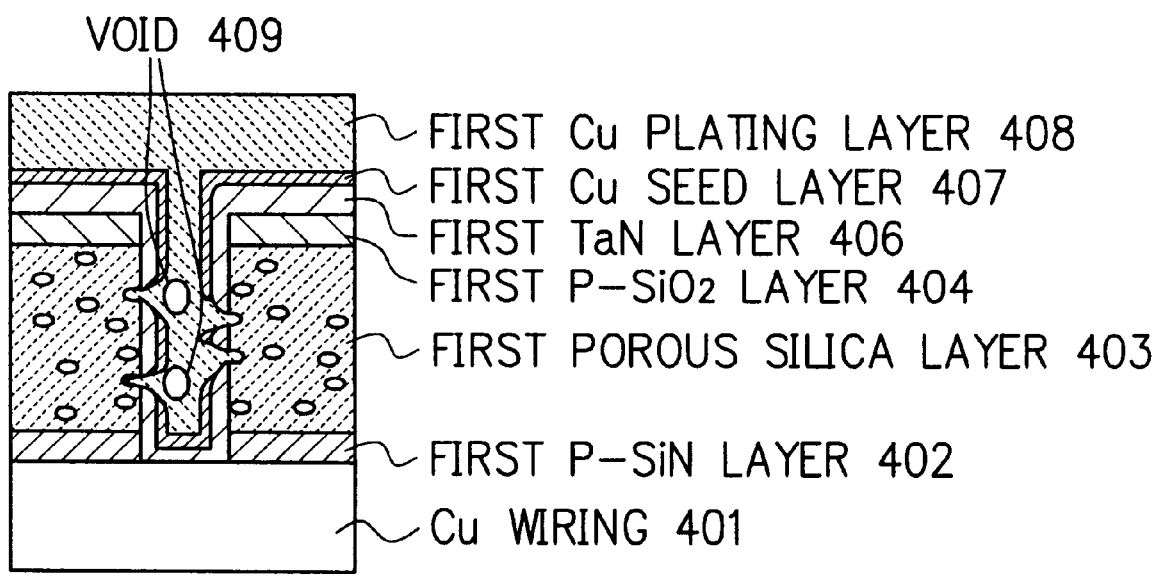

Referring now to the drawings, a description will be given in detail of preferred embodiments in accordance with the present invention.

FIG. 4A through FIG. 10B are cross sectional views showing a manufacturing method of a semiconductor device in accordance with a first embodiment of the present invention. In the following, the manufacturing method of the first embodiment which has been conducted by the present inventor will be described in detail referring to FIGS. 4A through 10B.

Figure 4A:
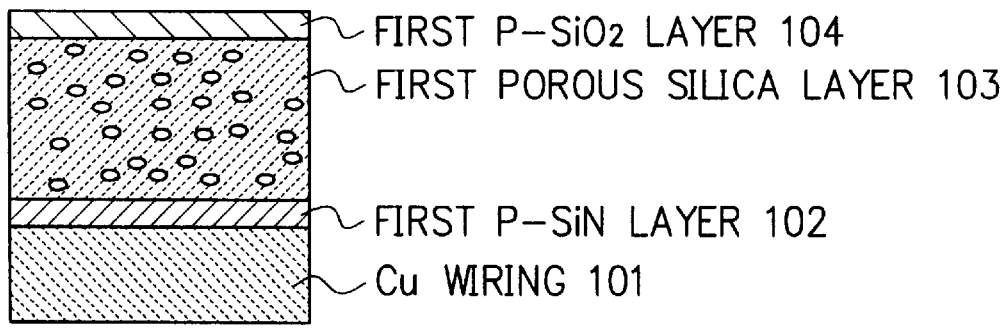
Figure 4B:
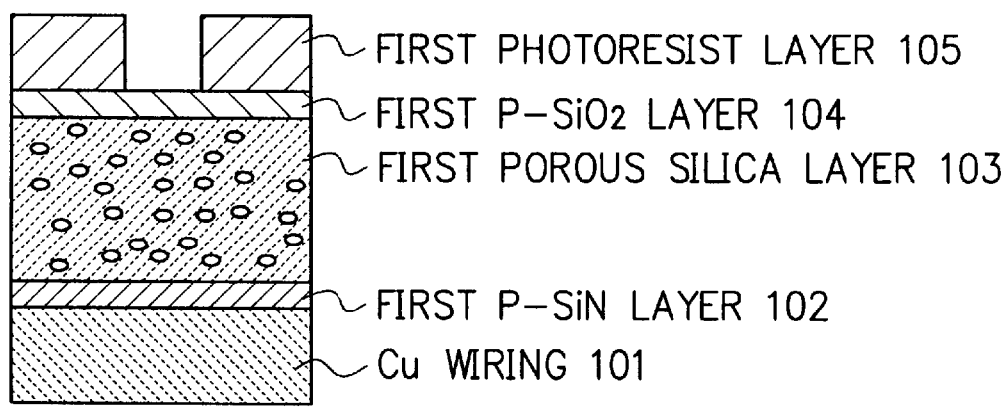
Figure 4C:
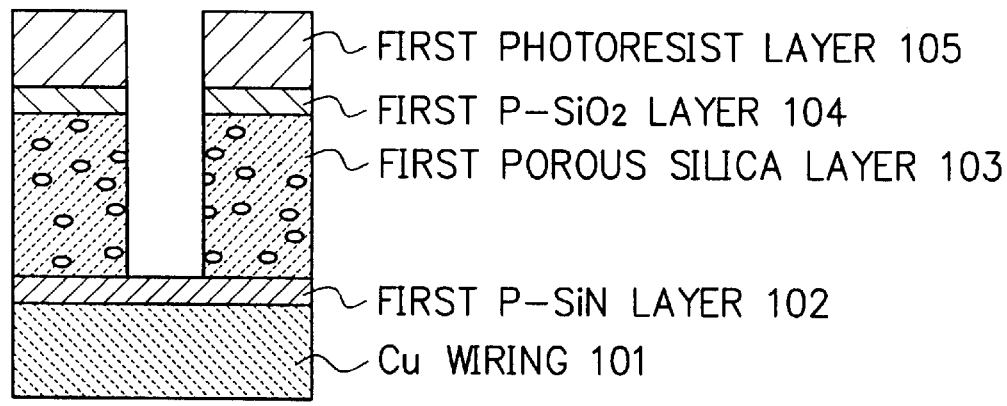
Figure 5A:
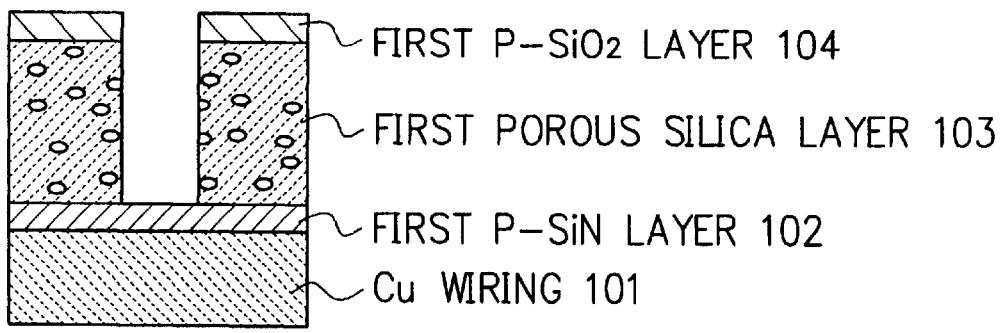

First, a first P-SiN (Plasma SiN) layer 102 of a thickness of about 500 Å was formed on Cu wiring 101 by means of plasma CVD. Porous silica was coated on the first P-SiN layer 102 and baked at 400° C. for 30 minutes, thereby a porous silica layer 103 of a thickness of about 4000 Å was formed. On the first porous silica layer 103, a first P-SiO$_2$ (Plasma SiO2) layer 104 of a thickness of about 1000 Å was formed (FIG. 4A). Subsequently, a first photoresist layer 105 was patterned on the first P-SiO$_2$ layer 104 (FIG. 4B). The first P-SiO$_2$ layer 104 and thereafter the first porous silica layer 103 were processed (etched) using the first photoresist layer 105 as a mask. The etching was stopped at the first P-SiN layer 102 as an etching stopper (FIG. 4C). Subsequently, the first photoresist layer 105 was removed by means of oxygen plasma ashing and thereafter wet stripping was conducted (FIG. 5A).

Figure 5B:
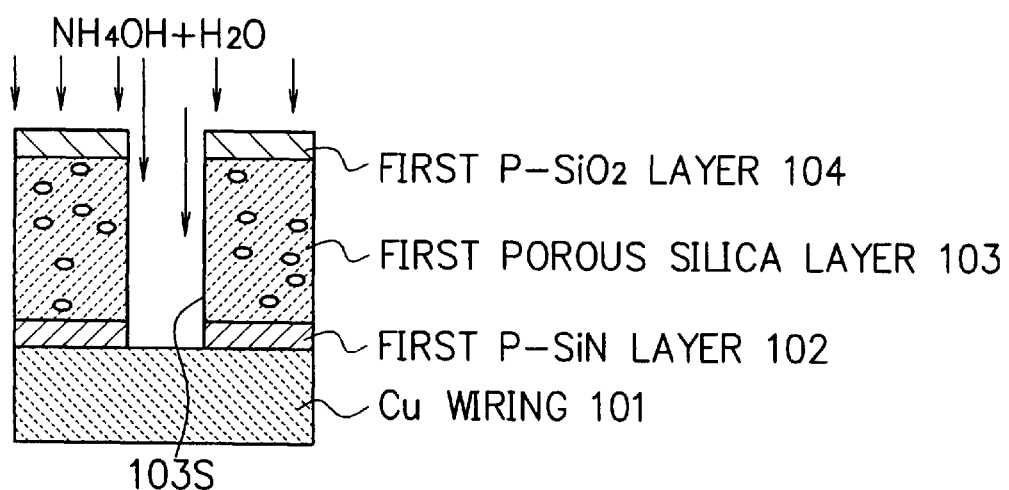
Figure 5C:
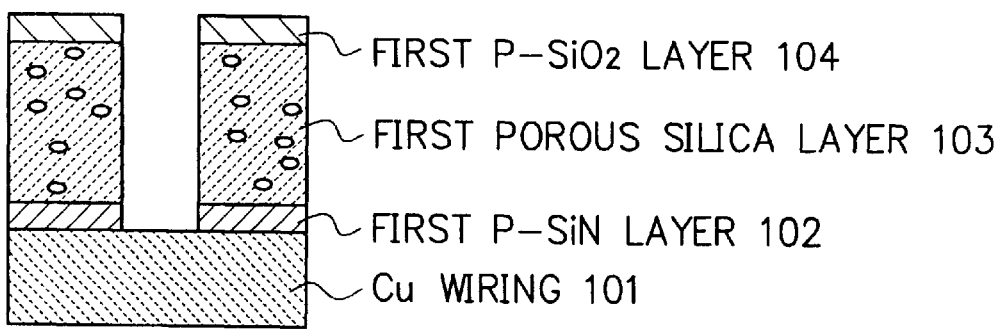

The above structure including the processed first porous silica layer 103 was exposed to vapor of ammonia water (NH$_4$OH+H$_2$O) under low pressure and thereby the reaction (gelation, dehydration condensation) of the porous silica was promoted, thereby the microvoids near the processed (etched) surface 103S of the first porous silica layer 103 were removed and the processed surface 103S was smoothed (FIG. 5B). Subsequently, the first P-SiN layer 102 which had been used as the etching stopper was removed by etching back (using no mask), thereby the Cu wiring 101 was exposed (FIG. 5C).

Figure 6A:
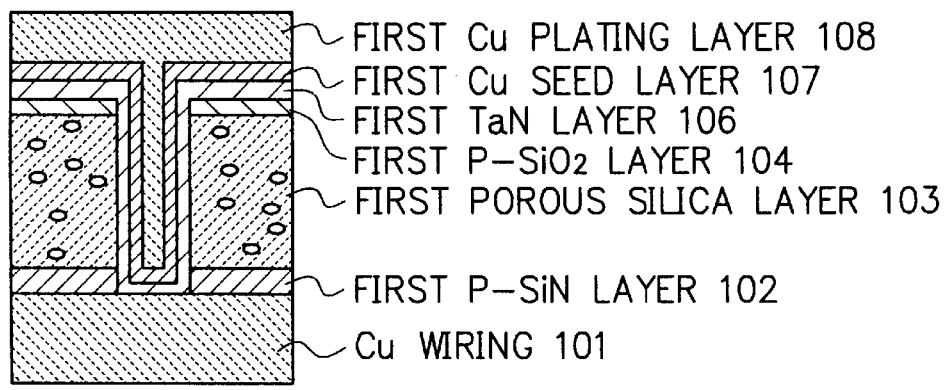
Figure 6B:
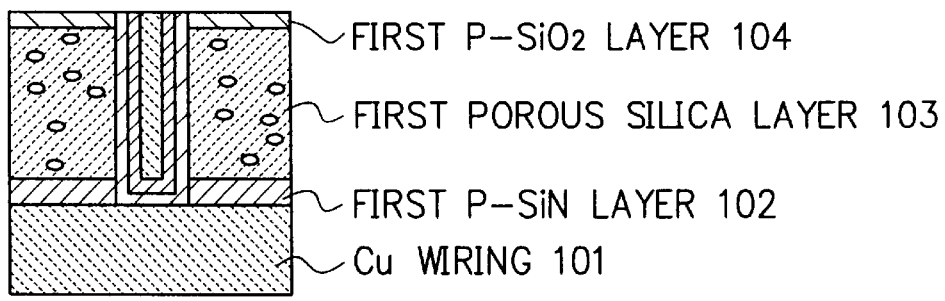

Subsequently, RF plasma etching as pretreatment was conducted in a sputter chamber and thereafter a first TaN layer 106 of a thickness of about 500 Å was formed by means of collimated sputtering. A first Cu seed layer 107 was sputtered to a thickness of about 500 Å and thereafter a first Cu plating layer 108 was formed thereon to a thickness of about 8000 Å (FIG. 6A). The first Cu plating layer 108, the first Cu seed layer 107 and the first TaN layer 106 (upper part of the structure) were removed by means of Cu CMP (Chemical Mechanical Polishing) (FIG. 6B).

Figure 7:
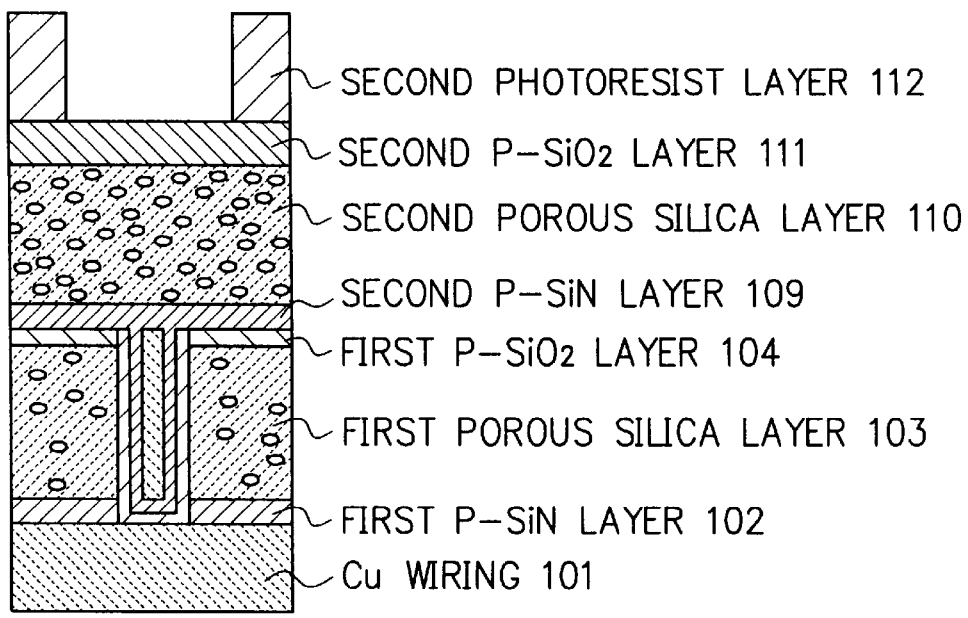

A second P-SiN layer 109 (about 500 Å) and a second porous silica layer 110 (about 4000 Å) and a second P-SiO$_2$ layer 111 (about 1000 Å) were stacked, and a second photoresist layer 112 was patterned thereon (FIG. 7).

Figure 8A:
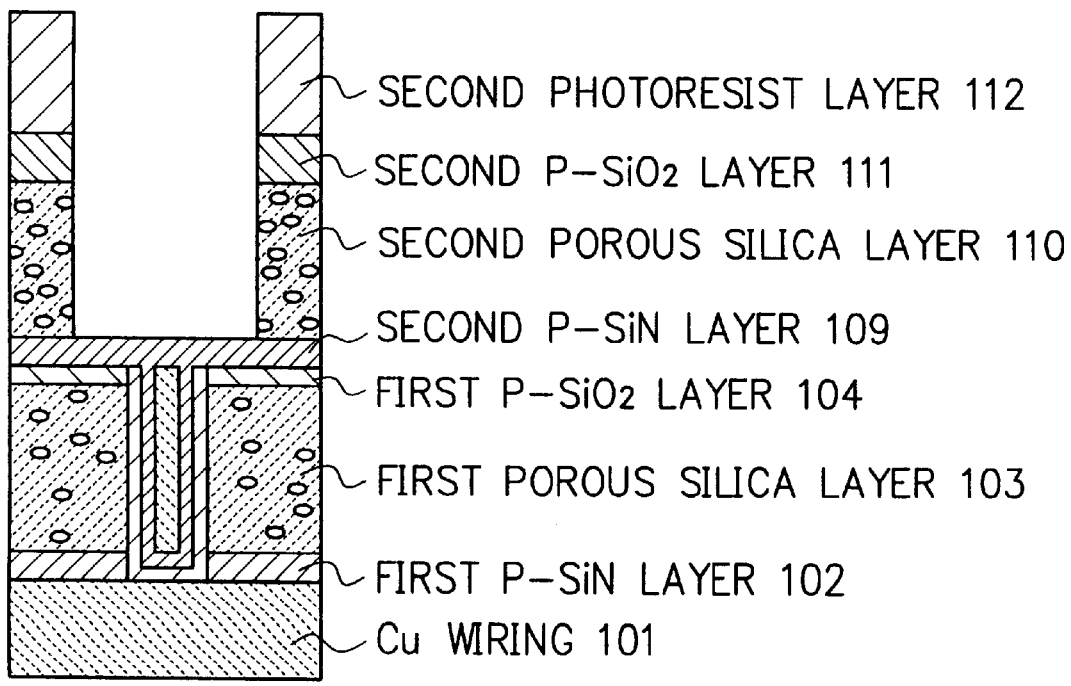
Figure 8B:
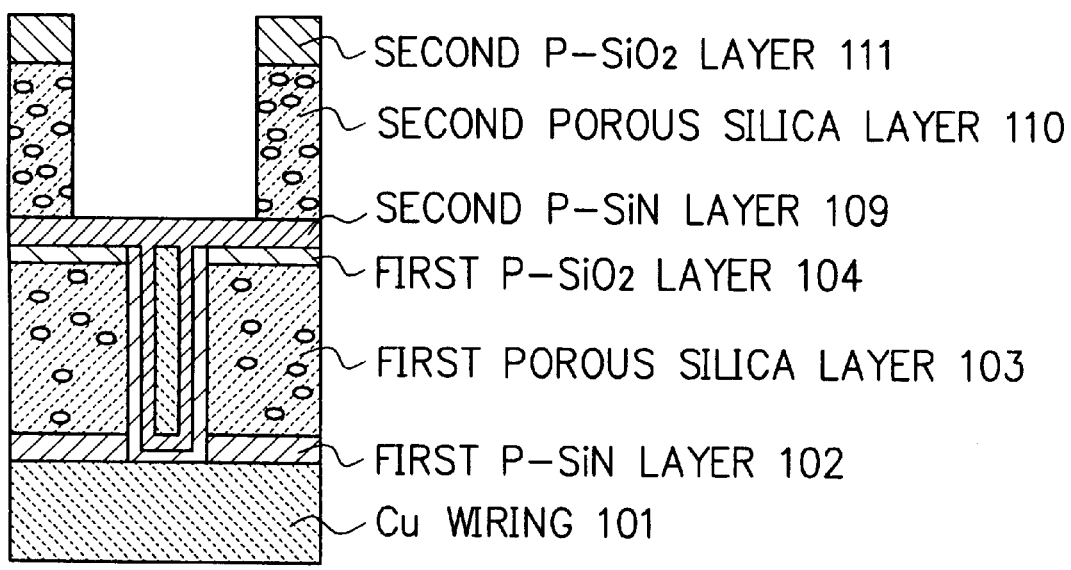

The second P-SiO₂ layer 111 and thereafter the second porous silica layer 110 were processed (etched) using the second photoresist layer 112 as a mask. The etching was stopped at the second P-SiN layer 109 as an etching stopper (FIG. 8A). The second photoresist layer 112 was removed by means of oxygen plasma ashing and thereafter wet stripping was conducted (FIG. 8B).

Figure 9A:
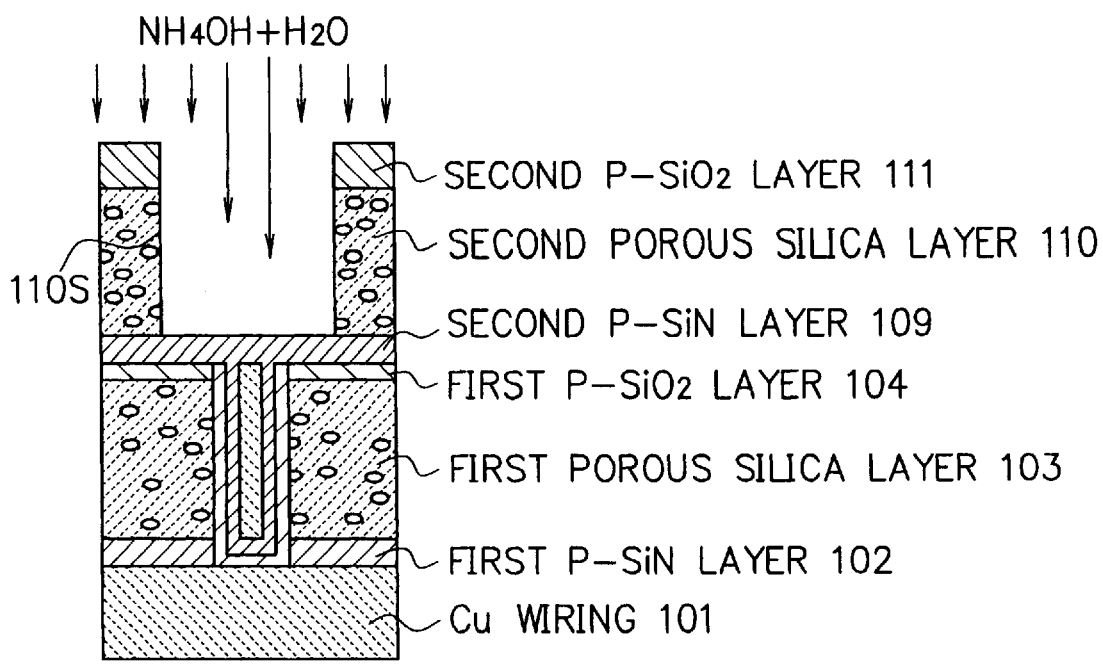
Figure 9B:
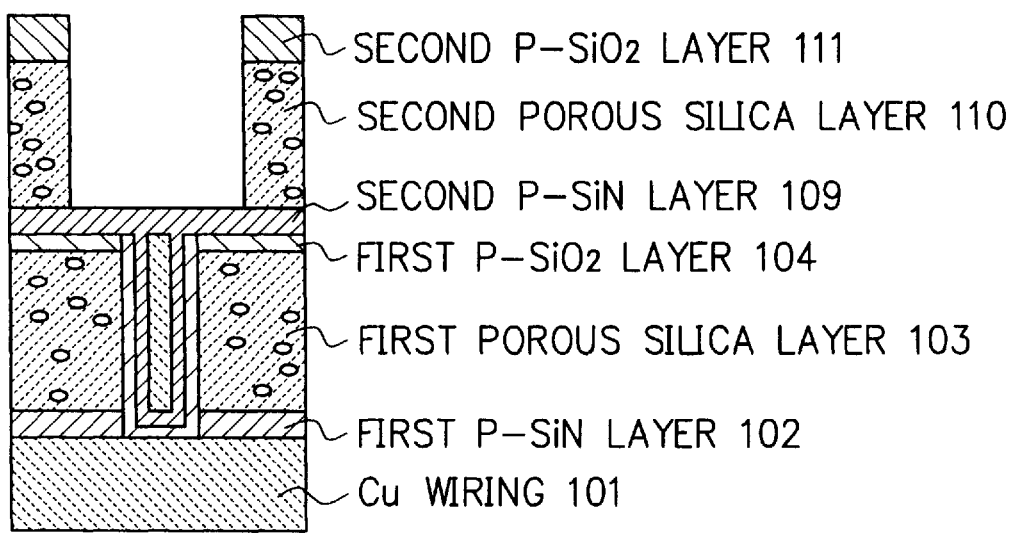

Subsequently, the above structure (wafer) including the processed second porous silica layer 110 was exposed to vapor of ammonia water (NH₄OH+H₂O) under low pressure (FIG. 9A). By the treatment, the microvoids near the processed (etched) surface 110S of the second porous silica layer 110 could be eliminated and the processed surface 110S could be smoothed (FIG. 9B).

Subsequently, RF plasma etching as pretreatment was conducted in a sputter chamber and thereafter a second TaN layer 113 of a thickness of about 500 Å was formed. A second Cu seed layer 114 of a thickness of about 500 Å and a second Cu plating layer 115 were formed on the second TaN layer 113 (FIG. 10A). As shown in FIG. 10A, no voids were formed in the plug.

The second Cu plating layer 115, the second Cu seed layer 114 and the second TaN layer 113 (upper part of the structure) were removed by means of Cu CMP (FIG. 10B). Incidentally, the remaining lower part of the second Cu plating layer 115 which is shown in FIG. 10B is used as wiring which extends in a direction perpendicular to paper (from the front to the back of FIG. 10B). Thereafter, such processes were repeated and thereby multilayer wiring was completed.

As described above, by the manufacturing method of a semiconductor device in accordance with the first embodiment of the present invention, abnormalities in the coating of the barrier metal layer (TaN) and the seed layer which are formed on the processed surface of the porous silica layer can be eliminated and voids occurring in the Cu plating layer can be eliminated, thereby multilayer damascene wiring can be formed successfully even when the porous silica (porous material) is employed as the interlayer low-permittivity insulating layer. Incidentally, while vapor of ammonia water was used in the above embodiment for removing the microvoids near the processed surfaces of the porous silica layers (103, 110), it is also possible to use ammonia water for the removal of the microvoids and the same effects can be attained.

FIG. 11A through FIG. 13C are cross sectional views showing a manufacturing method of a semiconductor device in accordance with a second embodiment of the present invention.

While the processed surface of the porous silica layer was exposed to vapor of ammonia water before the formation of the barrier metal layer in the first embodiment, in the second embodiment, hydrophobic treatment is conducted after the ammonia water vapor treatment. By the hydrophobic treatment, the via resistance (the resistance of the via hole) can be stabilized further. This time, the present inventor used porous silica including Si—H bonds for the porous silica layers. When the porous silica layer (including the Si—H bonds) is processed (etched), Si—OH bonds increase in part of the porous silica layer near the processed surface. Remaining Si—H bonds also change into Si—OH bonds due to the reaction to the vapor of ammonia water and thereby the processed surface becomes a dense film including large amount of Si—OH bonds (silanol). However, the Si—OH bonds are hydrophilic groups and thus tend to become moist when left in the atmosphere and thereby the via resistance becomes unstable. By conducting the hydrophobic treatment and thereby changing the Si—OH bonds into Si—(CH₃) bonds etc., stable via resistance can be realized. In the following, the manufacturing method of the second embodiment which has been conducted by the present inventor will be described in detail referring to FIGS. 11A through 13C.

Figure 11A:
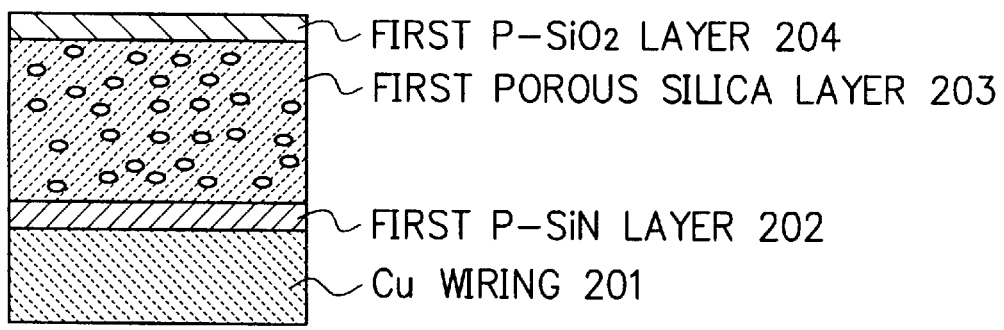
Figure 11B:
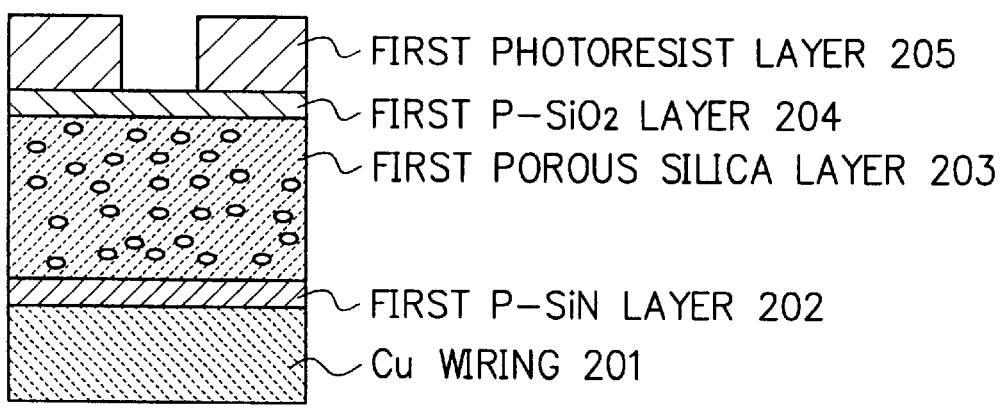
Figure 11C:
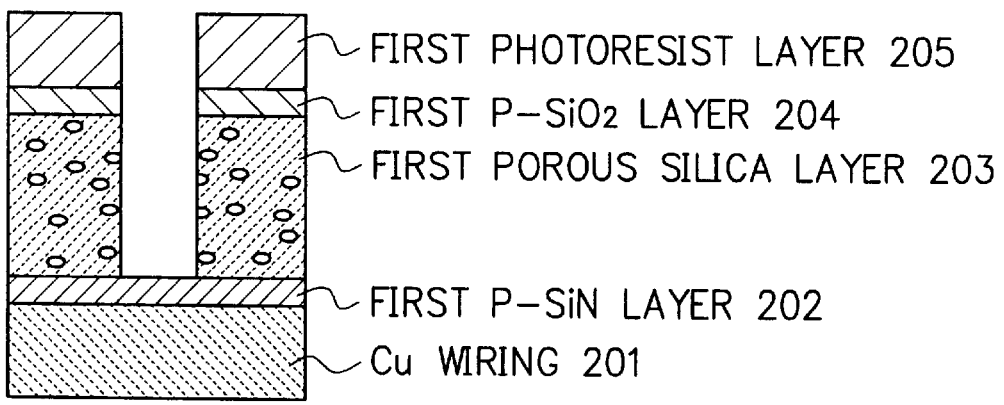
Figure 12A:
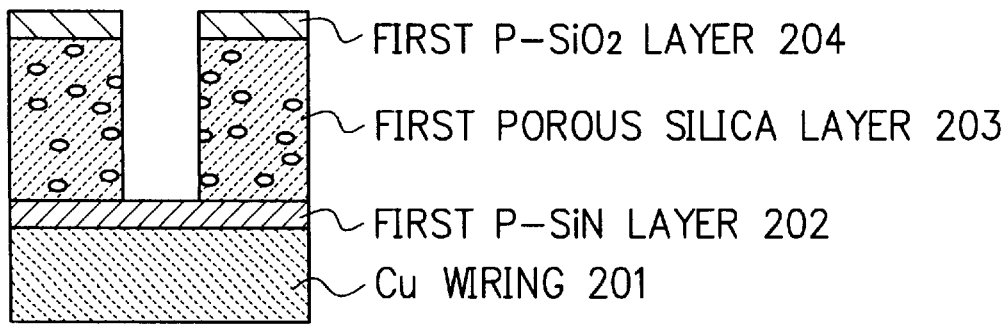

First, a first P-SiN (Plasma SiN) layer 202 of a thickness of about 500 Å was formed on Cu wiring 201 by means of plasma CVD. Porous silica was coated on the first P-SiN layer 202 and baked at 400° C. for 30 minutes, thereby a porous silica layer 203 of a thickness of about 4000 Å was formed. On the first porous silica layer 203, a first P-SiO₂ (Plasma SiO2) layer 204 of a thickness of about 1000 Å was formed (FIG. 11A). Subsequently, a first photoresist layer 205 was patterned on the first P-SiO₂ layer 204 (FIG. 11B). The first P-SiO₂ layer 204 and thereafter the first porous silica layer 203 were processed (etched) using the first photoresist layer 205 as a mask. The etching was stopped at the first P-SiN layer 202 as an etching stopper (FIG. 11C). Subsequently, the first photoresist layer 205 was removed by means of oxygen plasma ashing and thereafter wet stripping was conducted (FIG. 12A).

Figure 12B:
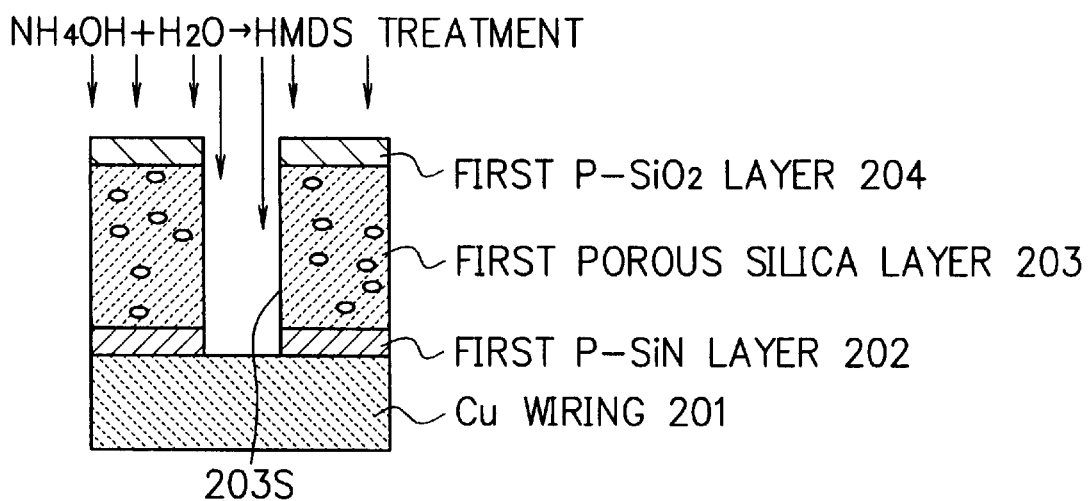

The above structure including the processed first porous silica layer 203 was exposed to vapor of ammonia water (NH₄OH+H₂O) under low pressure and thereby the reaction (gelation, dehydration condensation) of the porous silica was promoted, thereby the microvoids near the processed (etched) surface 203S of the first porous silica layer 203 were removed and the processed surface 203S was smoothed (FIG. 12B). The interface of the porous silica 203 includes a large amount of silanol (Si—OH). Therefore, the following reaction was promoted by exposing the interface to an HMDS (hexamethyldisilazane) gas atmosphere:

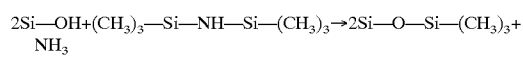

By the reaction, the hydrophilic groups Si—OH were changed into the hydrophobic groups Si—(CH₃).

Figure 12C:
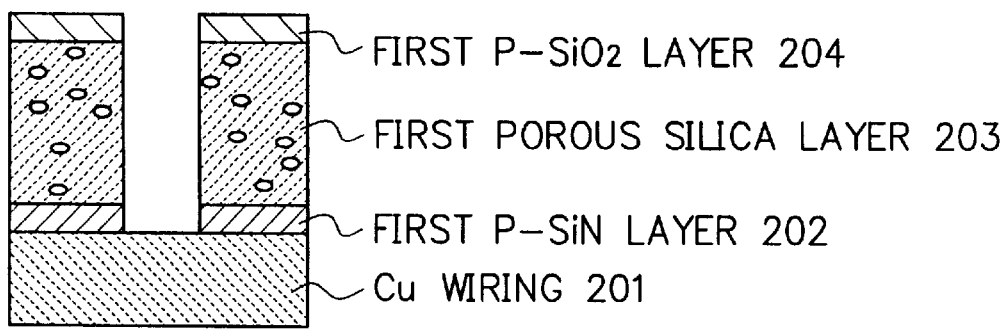

Subsequently, the first P-SiN layer 202 which had been used as the etching stopper was removed by etching back (using no mask), thereby the Cu wiring 201 was exposed (FIG. 12C). RF plasma etching as pretreatment was conducted in a sputter chamber and thereafter a first TaN layer 206 of a thickness of about 500 Å was formed by means of collimated sputtering. A first Cu seed layer 207 was sputtered to a thickness of about 500 Å and thereafter a first Cu plating layer 208 was formed thereon to a thickness of about 8000 Å (FIG. 13A). Subsequently, the first Cu plating layer 208, the first Cu seed layer 207 and the first TaN layer 206 (upper part of the structure) were removed by means of Cu CMP (Chemical Mechanical Polishing) (FIG. 13B).

Thereafter, processes similar to the first embodiment were conducted and thereby multilayer wiring was formed (FIG. 13C).

As described above, by the manufacturing method of a semiconductor device in accordance with the second embodiment of the present invention, the via resistance can be stabilized further and thereby abnormal increase of the via resistance can be avoided.

FIG. 14A through FIG. 16C are cross sectional views showing a manufacturing method of a semiconductor device in accordance with a third embodiment of the present invention.

In the manufacturing method of a semiconductor device of the third embodiment which is shown in FIGS. 14A through 16C, "ammonia plasma treatment" is conducted for the removal of photoresist and the elimination of microvoids (densification of a processed surface). In the following, the manufacturing method of the third embodiment which has been conducted by the present inventor will be described in detail referring to FIGS. 14A through 16C.

Figure 14A:
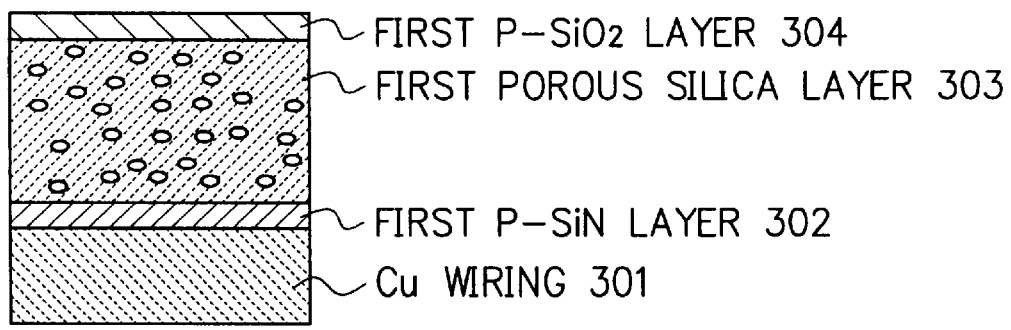
Figure 14B:
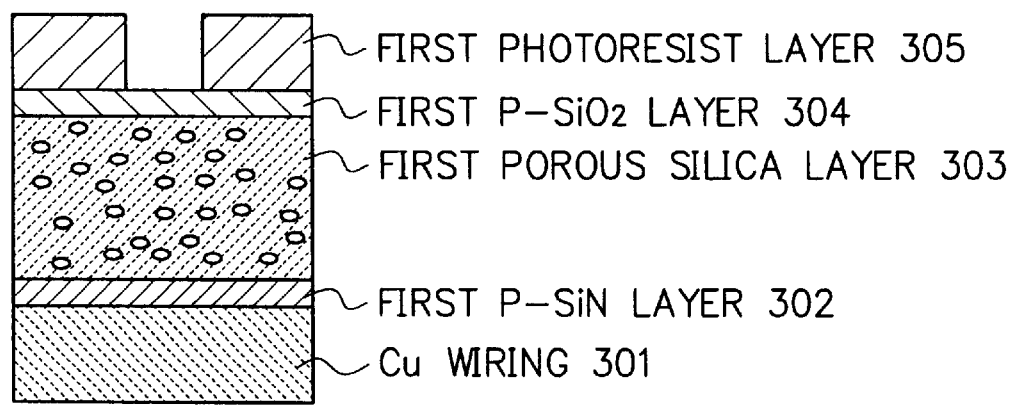
Figure 14C:
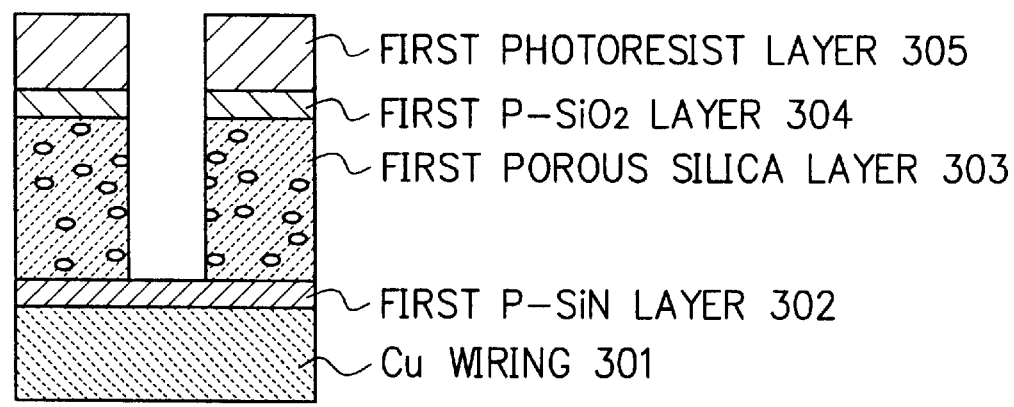

First, a first P-SiN (Plasma SiN) layer 302 of a thickness of about 500 Å was formed on Cu wiring 301 by means of plasma CVD. Porous silica was coated on the first P-SiN layer 302 and baked at 400° C. for 30 minutes, thereby a porous silica layer 303 of a thickness of about 4000 Å was formed. On the first porous silica layer 303, a first P-SiO$_2$ (Plasma SiO2) layer 304 of a thickness of about 1000 Å was formed (FIG. 14A). Subsequently, a first photoresist layer 305 was patterned on the first P-SiO$_2$ layer 304 (FIG. 14B). The first P-SiO$_2$ layer 304 and thereafter the first porous silica layer 303 were processed (etched) using the first photoresist layer 305 as a mask. The etching was stopped at the first P-SiN layer 302 as an etching stopper (FIG. 14C).

Figure 15A:
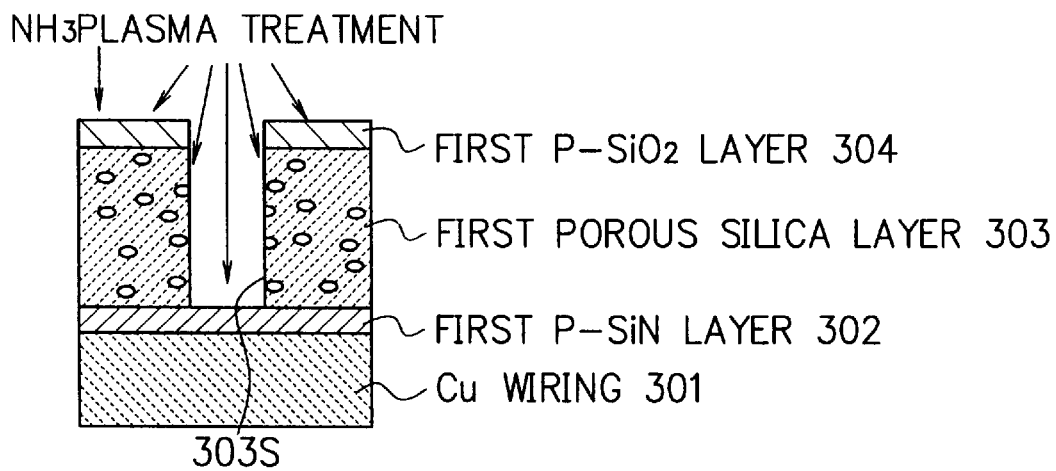
Figure 15B:
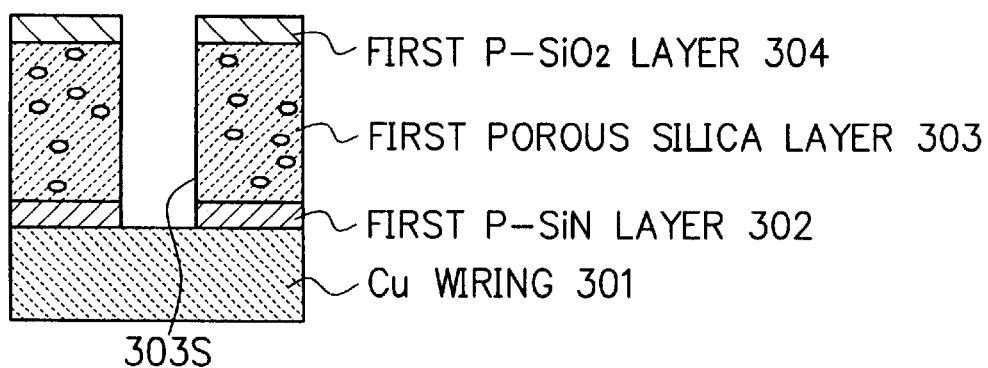

Subsequently, a hardened layer of the first photoresist layer 305 was removed by means of the ammonia plasma treatment. The ammonia plasma treatment was conducted using ammonia gas (200° C., 0.2 Torr) and a downflow-type asher which generates plasma by use of a microwave (FIG. 15A). Thereafter, residue of the photoresist was removed by wet stripping. By the above treatment, the microvoids near the processed (etched) surface 303S of the first porous silica layer 303 could be eliminated and the processed surface 303S could be smoothed and the part near the processed surface 303S became a dense film (FIG. 15B).

Figure 15C:
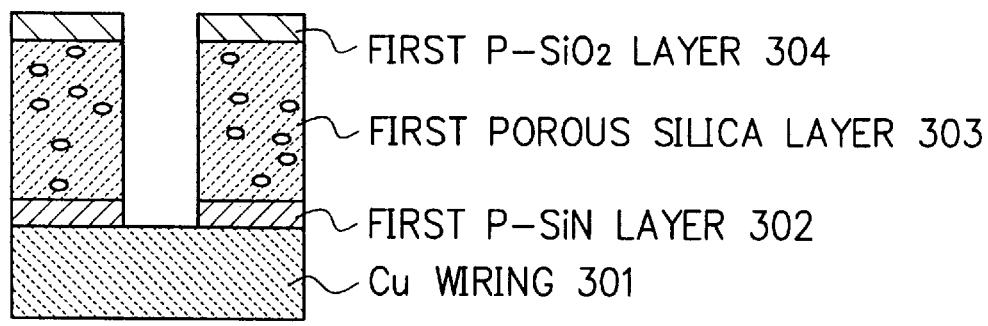

Subsequently, the first P-SiN layer 302 which had been used as the etching stopper was removed by etching back (using no mask), thereby the Cu wiring 301 was exposed (FIG. 15C). RF plasma etching as pretreatment was conducted in a sputter chamber and thereafter a first TaN layer 306 of a thickness of about 500 Å was formed by means of collimated sputtering. A first Cu seed layer 307 was sputtered to a thickness of about 500 Å and thereafter a first Cu plating layer 308 was formed thereon to a thickness of about 8000 Å (FIG. 16A). Subsequently, the first Cu plating layer 308, the first Cu seed layer 307 and the first TaN layer 306 (upper part of the structure) were removed by means of Cu CMP (Chemical Mechanical Polishing) (FIG. 16B). Thereafter, processes similar to the first embodiment were conducted and thereby multilayer wiring was formed (FIG. 16C).

As described above, by the manufacturing method of a semiconductor device in accordance with the third embodiment of the present invention, the removal of the photoresist and the elimination of the microvoids and the densification of the porous silica near the processed surface 303S can be conducted simultaneously, thereby the number of steps necessary for the formation of the plug (via hole) can be reduced in comparison with the previous embodiments. Incidentally, while the ammonia plasma treatment was also used for the removal of the photoresist in the above third embodiment, it is also possible to conduct the photoresist removal by another method and thereafter execute the ammonia plasma treatment for the microvoid elimination and the processed surface densification.

As set forth hereinabove, in the semiconductor device and the manufacturing method of a semiconductor device in accordance with the present invention, even when a porous material (such as porous silica) is used for an interlayer insulating layer and a hole or a trench is formed in the interlayer insulating layer by processing the interlayer insulating layer, microvoids near the processed surface of the hole or trench can be eliminated and thereby coating of an electrically conductive material (Cu etc.) on the processed surface of the hole or trench can be conducted successfully in the following steps. Therefore, yield of gap-filling steps can be increased remarkably and thereby the manufacture of semiconductor devices of stable performance can be realized. By the use of the porous material for the interlayer insulating layer, the space between wires in the semiconductor device can be made smaller and thereby miniaturization and speeding up of semiconductor device can be attained. Incidentally, while the above embodiments have been described on the assumption that the interlayer insulating layer is formed of a porous material, the present invention can widely be applied to cases where the interlayer insulating layer is formed of a low density material.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device in which an interlayer insulating layer is formed of a low density material and a hole or a trench is formed in the interlayer insulating layer by processing the interlayer insulating layer and an electrically conductive material is coated on the processed surface of the hole or trench for establishing electrical connection wherein:

the density of part of the interlayer insulating layer near the processed surface of the hole or trench is increased in comparison with other parts of the interlayer insulating layer, wherein the low density material is a porous material, and wherein the porous material is porous silica.

2. A semiconductor device as claimed in claim 1, wherein the porous silica at least includes Si—H bonds and/or Si—CH3 bonds.

3. A semiconductor device in which an interlayer insulating layer is formed of a low density material and a hole or a trench is formed in the interlayer insulating layer by processing the interlayer insulating layer and an electrically conductive material is coated on the processed surface of the hole or trench for establishing electrical connection, wherein:

microvoids are removed in part of the interlayer insulating layer near the processed surface of the hole or trench, wherein the low density material is a porous material, and wherein the porous material is porous silica.

4. A semiconductor device as claimed in claim 3, wherein the porous silica at least includes Si—H bonds and/or Si—CH3 bonds.

* * * * *